United States Patent [19]

Vaughn

[11] 4,034,309
[45] July 5, 1977

[54] APPARATUS AND METHOD FOR PHASE SYNCHRONIZATION

[75] Inventor: Julian Edgar Vaughn, Campbell, Calif.

[73] Assignee: International Business Machines Corporation, Armonk, N.Y.

[22] Filed: Dec. 23, 1975

[21] Appl. No.: 643,714

[52] U.S. Cl. .................... 331/1 A; 307/294; 328/155; 331/8; 331/17
[51] Int. Cl.² .................................................. H03B 3/04
[58] Field of Search ................ 331/1 A, 8, 17; 328/155; 307/294

[56] References Cited
UNITED STATES PATENTS

| | | | |
|---|---|---|---|
| 3,350,658 | 10/1967 | Walker | 331/1 A |
| 3,599,110 | 8/1971 | Gindi | 331/1 A |
| 3,614,635 | 10/1971 | LaPine | 331/1 A |
| 3,701,039 | 10/1972 | Lang et al. | 331/1 A |
| 3,939,438 | 2/1976 | Taylor | 331/1 A |

*Primary Examiner*—John Kominski
*Attorney, Agent, or Firm*—Richard E. Cummins

[57] ABSTRACT

In a phase locking oscillator servosystem, the phase of a voltage controlled oscillator (VCO) is determined by a stored control voltage representative of phase error. Positive and negative constant current sources are switched to an integrator, which provides the control voltage, at times determined by a reference input signal and the fed back VCO output. The current sources are switched simultaneously to or away from the integrator in response to a predetermined condition and are switched individually away from or to the integrator in response to respective input and output signals. The conditions for switching are such that a sufficient time interval for switching circuit operation is established between said individual and simultaneous switchings.

7 Claims, 3 Drawing Figures

APPARATUS AND METHOD FOR PHASE SYNCHRONIZATION

BACKGROUND OF THE INVENTION

1. Field of the Invention

This invention relates to a novel and improved apparatus and method of phase synchronization useful in a binary data processing apparatus wherein repetitive output signals are synchronized with repetitive input signals applied to the system.

2. Description of the Prior Art

In reading back digital data from, for example, magnetic recording media, a gate is normally triggered by an electronic clock to permit each bit to be read and interpreted properly. The clock signal is normally generated by an oscillator. To ensure correct frequency and phase of the clock signal, it is desirable to lock the oscillator to the data itself by means of a feedback loop. In a phase locking oscillator servosystem, the error detection scheme used in the feedback loop compares the phase of the data signal with that of the oscillator signal. Any difference in phase is used to generate an error signal which is employed to reduce the phase difference. It may be noted that the quantity to be controlled, phase, increases linearly with time, and thus, the input (or command) to the feedback loop is a ramp function.

From basic servo theory, it is known that to follow a ramp input, the feedback loop must contain at least one integration (Type 1 system) but that an error (phase misalignment) will exist in the steady state, if such a system is used. A minimum steady-state error requires a high servo gain which however decreases the system's ability to reject "jitter" or "noise."

Basic servo theory also indicates that if a second integration is cascaded within the feedback loop (Type 2 system), the steady-state error in following the ramp input can be completely eliminated and the noise rejection capability of the system be made now independent of the steady-state error.

Two prior patents showing Type 2 phase locking oscillator servosystems are U.S. Pat. Nos. 3,614,635 (Lapine et al.) and 3,701,039 (Lang et al.). In the servosystems described therein a signal predicting the time of occurrence of a clock signal characteristic is derived from each received data signal. When the system is synchronized, the prediction signal and the clock signal characteristic should be coincident. The two signals are applied to two channels and one signal is delayed in one channel while the other is delayed in the other channel. In each channel, the delayed and undelayed signals are applied to an AND gate. The outputs of the AND gates are used respectively to operate positive and negative current sources which charge and discharge an integrating network. If data and clock are in phase, both sources are operated for the delay period and two equal and opposite increments of charge, which thus cancel out, are applied to the integrator. If data and clock are not in phase, then the times of operation of the two sources are unequal and an incremental charge is applied to the integrator which represents the phase difference. The overall charge on the integrator is fed back to control the oscillator.

A disadvantage of this kind of system is that the current sources employed may have to operate for very short periods of time, right down to zero pulse width for certain phase differences. Thus high frequency switching circuits are needed. These are expensive and, in fact, are not currently realizable with PNP transistors in integrated circuit form.

SUMMARY OF THE INVENTION

It is an object of this invention to provide both an apparatus and a method for synchronizing repetitive output signals, from a signal generator, with repetitive input signals.

It is a further object of this invention to provide a Type 2 phase locking oscillator servosystem that is capable of synchronizing the output of an oscillator with intermittently arriving data signals and correcting for both frequency and phase errors.

Another object is to provide such a servosystem employing switched constant current sources in which a minimum time is established between switchings of the same source.

In accordance with this invention repetitive output signals, which are to be synchronized with repetitive input signals, are fed back and compared with the input signals for a predetermined phase relationship. The comparison is effected by employing the input and output signals to control the switching of positive and negative constant currents to an integrator which integrates the net current to provide an indication of phase error. This phase error indication is then applied to control the phase of the output signals. The switching operations consist of individual switchings of the two constant currents in one sense and simultaneous switching of the two currents in the opposite sense and are logically determined by the input and output signals such that a sufficient time interval for operation of the switching circuitry is established between said individual and simultaneous switchings.

In one specific form of the invention, a phase locking oscillator servosystem has a voltage controlled oscillator (VCO) whose frequenly of operation is controlled by a control voltage stored on a capacitor. The VCO output is fed back to be compared in phase with an input signal with which it is to be synchronized. The result of the comparison controls a switching means for selectively operating positive and negative constant current sources of equal magnitude which charge or discharge the control voltage storage capacitor by an increment representative of the phase error. By providing a reference signal of appropriate duration in response to the arrival of an input signal, a reference signal generating means indicates the lapse, since the arrival of the input signal, of a predetermined interval. This interval exceeds one nominal period of the VCO by a predetermined amount. A logic means, responsive to at least the arrival of an input signal, causes the switching means simultaneously to operate both the current sources with net zero effect on the stored control voltage. Subsequently, one of the sources is disconnected from the control voltage storage capacitor when the reference signal terminates. The other source is disconnected when at least a second VCO output signal has been generated since the arrival of the input signal. If the VCO output and input data are in phase, these disconnections coincide and the control voltage does not change. If, however, there is a phase difference, then the storage capacitor receives a net charge increment to alter the VCO control voltage.

By employing a reference signal whose duration exceeds one VCO nominal period by a predetermined amount and by delaying disconnection of one of the current sources until at least the second received VCO output, it is ensured that the switching means does not have to operate at too high a frequency. The minimum pulse width which the switching means is required to handle is equal to the time by which the reference signal exceeds one nominal VCO period (i.e., the period of the VCO when synchronized with an input signal component of nominal frequency).

In a preferred form of the invention, this minimum pulse width is equal to half of the VCO nominal period. Also, in a preferred form of the invention the simultaneous operation of the two current sources is most conveniently caused by generation of the first VCO output subsequent to the input signal. Thus, the sources are only connected intermittently to the integrating capacitor and the need for them to be absolutely balanced is somewhat reduced.

BRIEF DESCRIPTION OF THE DRAWINGS

The foregoing and other objects, features and advantages of the invention will be apparent from the following, more particular, description of a preferred embodiment of the invention, as illustrated in the accompanying drawings, in which.

DESCRIPTION OF THE PREFERRED EMBODIMENT

Figure 1:
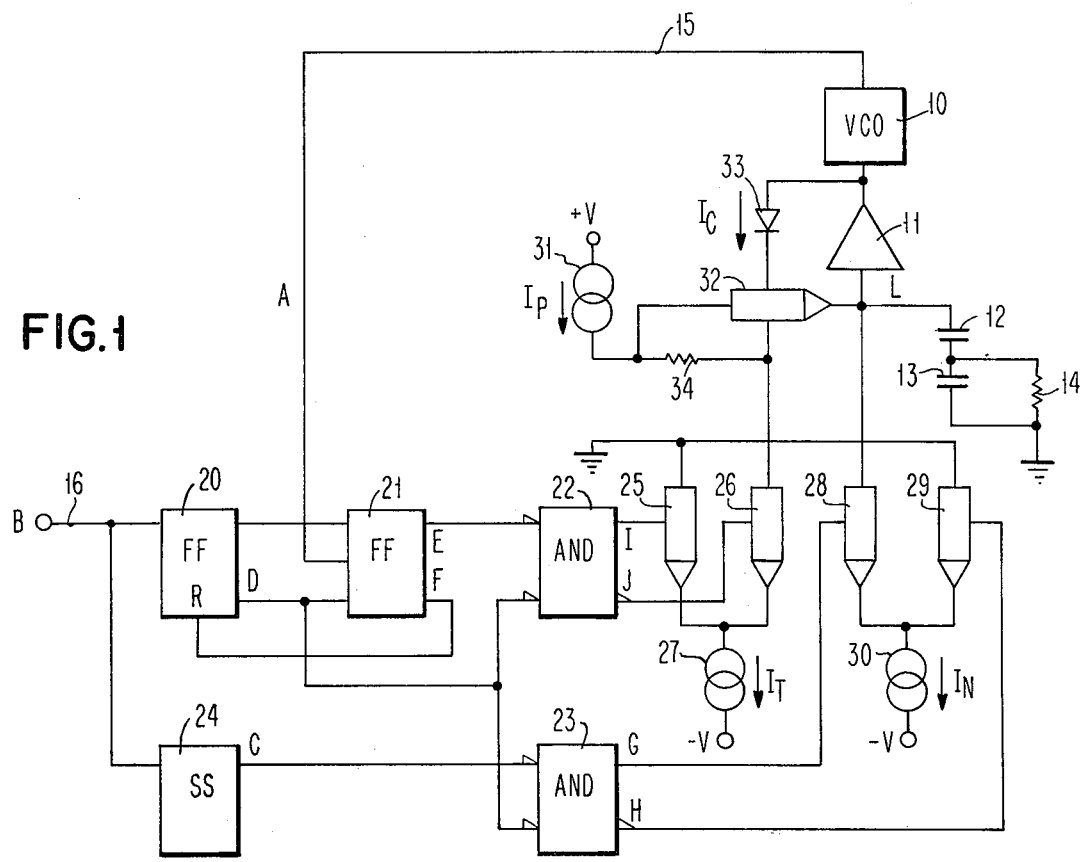
FIG. 1 is a schematic and block diagram of a phase locking oscillator servosystem in accordance with the invention.

The phase locking oscillator servosystem of FIG. 1 is a Type 2 system and comprises a voltage controlled oscillator (VCO) 10 designed to operate at frequencies above 10MHz and to accommodate frequency variations within ±10% of nominal. A transconductance amplifier 11 having a voltage gain of unity applies a control voltage stored on capacitors 12 and 13 to the input of the VCO to determine its frequency of operation. The output signals from the VCO 10 (Waveform A in FIG. 2) are fed back on line 15 for phase comparison with a train of input signals on line 16 (Waveform B, FIG. 2) with which they are to be synchronized.

The input signals may be from any source, but in this embodiment are assumed to be derived from coded data on a magnetic recording medium. The spacing of such input signals varies with their information content in accordance with the code employed and not all input signals may be suitable for phase comparison with the VCO output. Suitable signals are selected from the read back circuitry by gating circuitry controlled by the VCO output. Such circuitry forms no part of the present invention and will not be described further.

Returning now to FIGS. 1 and 2, the fed back VCO output on line 15 and the input data on line 16 are applied to logical circuitry comprising flip-flops 20 and 21 and AND gates 22 and 23. The outputs of the flip-flops are connected to the inputs of the AND gates. The input data signals are also applied to a single shot 24, the output of which is connected to AND gate 23.

The outputs of AND gate 22 are connected to respective bases of a pair of emitter coupled NPN transistor 25 and 26. The coupled emitters of transistors 25 and 26 are connected to a negative constant current source 27, producing a current of magnitude $I_t$. Similarly, the outputs of AND gate 23 are connected to the respective bases of a pair of emitter coupled NPN transistor 28 and 29. The coupled emitters of these transistors are connected to another negative constant current source 30, producing a current of magnitude $I_n$. The collectors of transistors 25 and 29 are coupled and grounded.

A positive constant current source 31 supplies a current of magnitude $I_p$ to the collector of a further transistor 32 and to a resistor 34. The current $I_p$ and $I_n$ are equal and opposite. The base of transistor 32 is connected to the collector of transistor 26 and also receives, by way of a diode 33, the fed back output of amplifier 11. The current $I_c$ through diode 33 is such that $I_t = I_p + I_c$. The emitter of transistor 32, together with the collector of transistor 28, is coupled to the storage capacitor 12 and also to the input to amplifier 11.

The transistors 28 and 29 effect the switching of current source 30 to and away from the storage capacitor 12. When transistor 28 is ON, current source 30 is connected to capacitor 12. When transistor 29 is ON, current source $I_n$ is disconnected from capacitor 12.

The switching of source 31 is more complex in order to avoid the need for high frequency PNP switching transistors. Basically, current from source 31 is steered either through a resistor 34 and transistor 26 to auxiliary current source 27, which acts as a current sink, or through transistor 32 to capacitor 12. The direction of flow of current from positive current source 31 is determined by the switching of auxiliary current source 27 by transistors 25 and 26. When transistor 25 is ON, auxiliary source 27 is connected to ground, transistor 26 is OFF and transistor 32 is ON. Current from source 31 flows through transistor 32 to charge capacitors 12 and 13. When transistor 26 is ON, transistor 32 is OFF and current from source 31 flows through a resistor 34 and the transistor 26 to source 27.

The switching time of transistor 32 is maintained independent of the voltage stored on capacitor 12 by referencing the base bias of the transistor to that voltage through amplifier 11 and diode 33. The amplifier has a high input impedance and a gain of unity over the desired operating range. If the switching time were not made independent of control voltage, spurious phase errors would result.

Figure 2:
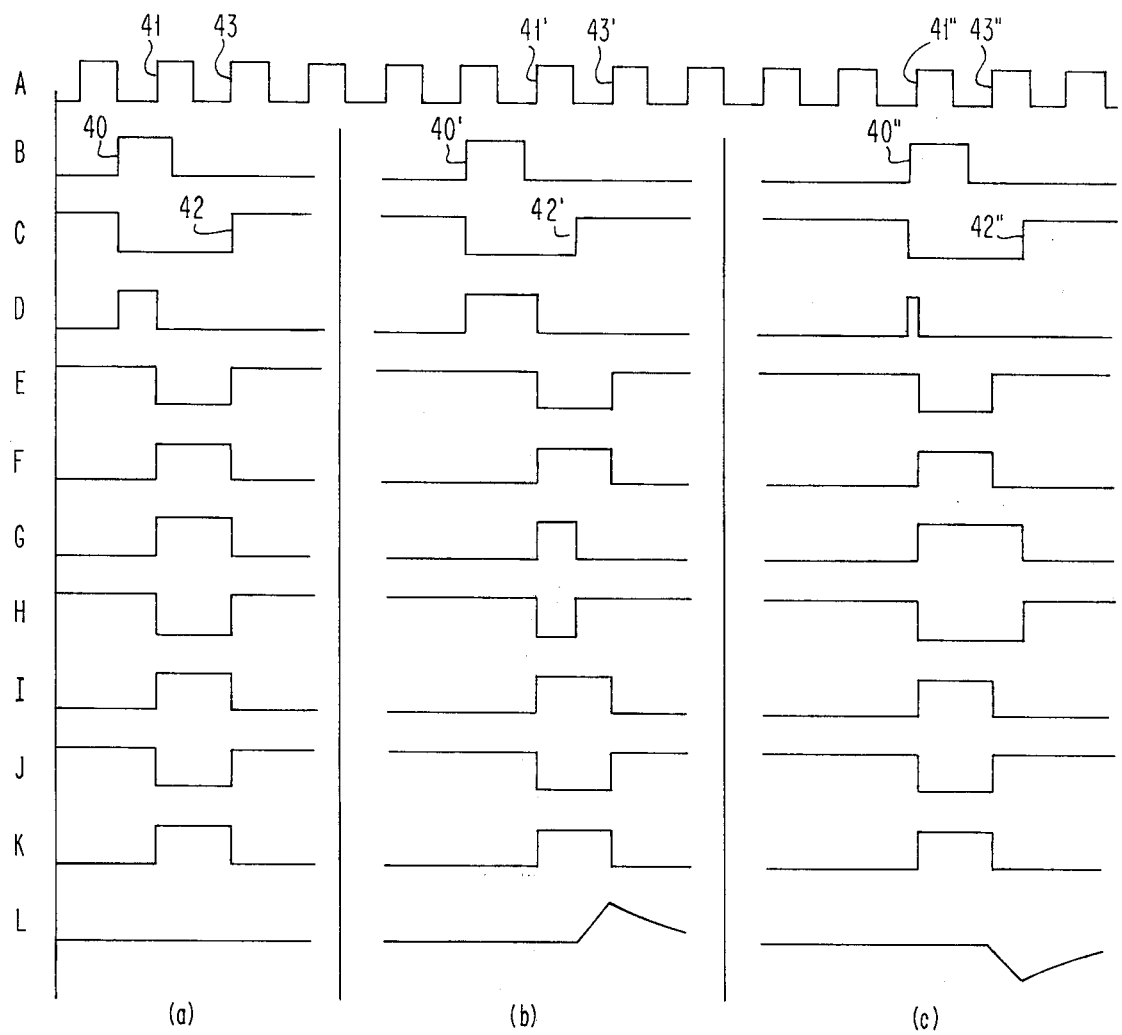
FIG. 2 is a series of waveforms occurring in the circuit of FIG. 1.

The operation of the circuit of FIG. 1 will be better understood by considering the effect of various input signals on the system, with particular reference to FIG. 2.

FIG. 2 is divided into three portions. FIG. 2a represents the situation where VCO output pulses, represented by waveform A, are synchronized with input data pulses represented by waveform B. FIG. 2b represents the situation where pulses B arrive early and FIG. 2c represents the situation where pulses B arrive late with respect to the VCO output.

It will be assumed initially that flip-flops 20 and 21 are reset, that transistor 26 is ON and transistors 28 and 32 are OFF. In this condition, neither current source 30 nor 31 is connected to control voltage capacitor 12. When a data pulse B arrives, flip-flop 20 and single shot 24 are set by leading edge 40. The output C of single shot 24 is negative so as to condition one input of AND 23 for a reference interval equal to 3/2 cycles of the nominal VCO frequency. The setting of flip-flop 20 to a negative level causes the reset output D to rise which leaves the AND condition of gates 22 and 23 unsatisfied. So, initially the arrival of the data pulse does not disturb the switching transistors 25, 26, 28, 29 and 32 and the voltage across capacitors 12 and 13 remains the same.

Upon the arrival of the leading edge 41 of the first clock pulse subsequent to transition 40, the flip-flop 21 is set (waveform E) by the outputs of flip-flop 20. The setting of flip-flop 21 causes the immediate resetting of flip-flop 20 by the fed back signal F. ANDs 22 and 23 are now satisfied and their outputs I and J and G and H are alternated.

This alternation causes the switching transistor pairs 25 and 26 and 28 and 29 to alternate conductive states, thereby applying current from both positive current source 31 and negative current source 30 to the control voltage storage network 12, 13 and 14. The net effect of this on the stored control voltage is zero as the currents $I_p$ and $I_n$ are equal and opposite.

The termination of the output C of single shot 24 at 42 disables AND 23 and switches negative current source 30 away from the control voltage storage network.

The arrival of the leading edge 43 of the next VCO output signal disables AND 22 and also switches positive current source 31 away from the control voltage storage network. In FIG. 2a, the VCO output is synchronized with the data and these switchings coincide. Thus, no net charge is supplied to the control voltage storage network.

In FIG. 2b, the data pulse arrives early at 40'. The current sources 30 and 31 are both switched to the control voltage storage network simultaneously at 41' but are switched away from the network at different times 42' and 43'. The positive current source 31 thus provides a positive increment of charge to the control voltage network as shown by waveform L. The positive current is integrated by the network 12, 13 and 14 which also functions as a phase lead compensation circuit to stabilize the system. Since capacitor 12 is much larger than capacitor 13, the resulting voltage change is mainly across capacitor 13 and decays rapidly through resistor 14. A smaller voltage change occurs across capacitor 12 which accumulates the effects of long term frequency changes and stores the frequency control voltage between samples.

In FIG. 2c, the data pulse arrives late at 40''. Again, both sources 30 and 31 are connected to the control voltage storage network simultaneously at 41'', but source 31 is disconnected at 43'' prior to the disconnection of source 30 at 42''. Thus, a negative current is momentarily applied for a time equal to the phase error and the control voltage is reduced.

By making the duration of the single shot output 3/2 nominal VCO periods and by making the complete cycle of phase error correction require two successive VCO inputs, the minimum time between switchings of either current source 30 or 31 is half the nominal VCO period.

Figure 3:
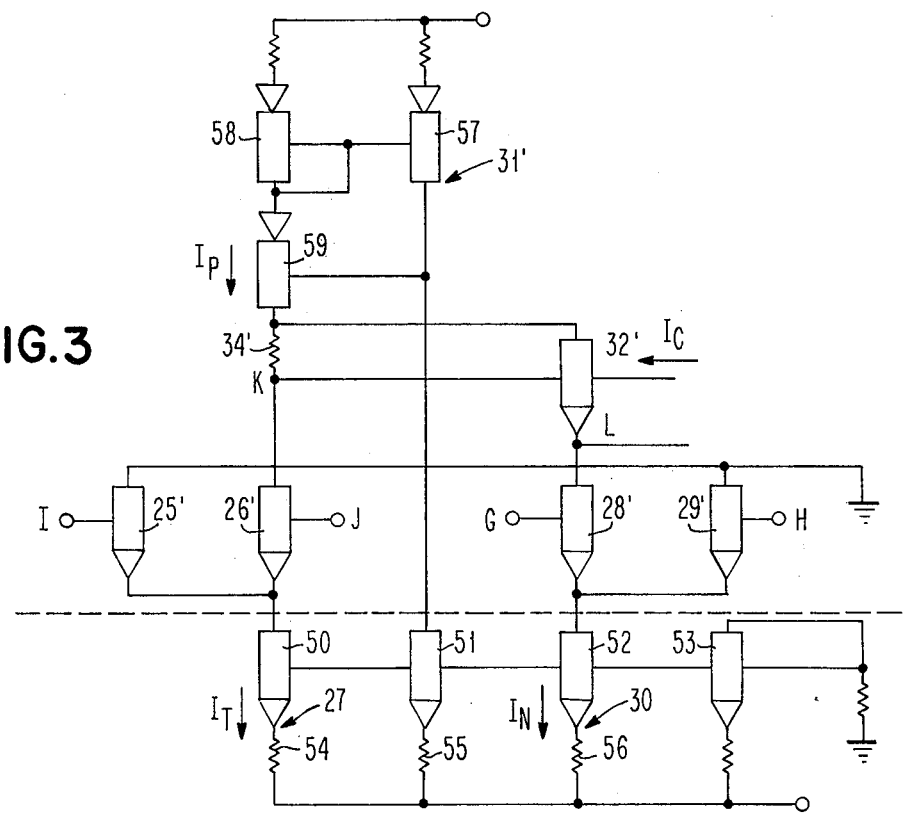
FIG. 3 is a circuit diagram showing greater detail of the current sources employed in the servosystem of FIG. 1.

One preferred implementation of the current sources 27, 30 and 31 within the system of FIG. 2, is illustrated in FIG. 3. Like components are indicated by like numerals with primes.

The three current sources 27', 30' and 31' are implemented as a common current source in which three transistors 50, 51 and 52 are slaves to a master transistor 53 having a direct collector-base connection. The current through each of transistors 50, 51 and 52 is additionally determined by resistors 54, 55 and 56. The resistors 55 and 56 are equal in magnitude whereas resistor 54 is of lower magnitude to provide the greater current $I_t$. The current flowing in transistor 51 is reflected in PNP transistor 57 to provide positive current $I_p$ through PNP transistors 58 and 59.

While the invention has been particularly shown and described with reference to a preferred embodiment, it will be understood by those skilled in the art that changes in form and details may be made therein without departing from the spirit and scope of the invention.

For example, although discrete data and VCO output signals have been illustrated, the invention is also applicable to continuous cyclically varying signals at either input or output of the system. In such a case, operation of the circuitry would be caused by the occurrence of predetermined characteristics of the continuous input and output signals such as peaks or zero crossings instead of the discrete input and output signals referred to herein.

What I claim is:

1. A phase locking oscillator system for synchronizing an output signal of a voltage controlled oscillator, having predetermined periodic characteristics of nominal frequency, with repetitive predetermined characteristics of an input signal applied to the system, comprising:

control voltage storage means including at least one capacitor for storing a control voltage;

a voltage controlled oscillator connected to receive said control voltage and whose frequency of operation is controlled by said control voltage;

a reference signal generating means adapted to receive said input signal and responsive to individual occurrences of said repetitive predetermined characteristic of said input signal to generate a reference signal indicating the lapse, since each said occurrence of said predetermined characteristic, of a reference interval exceeding one nominal period of said voltage controlled oscillator output signal by a predetermined time;

a positive constant current source;

a negative constant current source of equal magnitude;

a switching means, connected to said current sources for causing application of current from either of said current sources to said control voltage storage means;

and a logic means connected to said switching means and responsive to at least said individual occurrences of said predetermined characteristic of said input signal to cause said switching means simultaneously to apply current from both said current sources to said control voltage storage means, said logic means being further responsive to said reference signal indication to cause said switching means to remove current from one of said current sources from said control voltage storage means and further responsive to the occurrence of at least two successive predetermined periodic characteristics of said oscillator output signal, subsequent to each said occurrence of said predetermined characteristic of said input signal, to cause said switching means to remove current from the other of said current sources from said control voltage storage means, whereby a minimum time between switchings of current from the same current source is established which is at least equal to said predetermined time by which said reference interval exceeds one period of said oscillator output signal.

2. An oscillator system according to claim 1 wherein said logic means is instantaneously responsive to the first occurrence of said predetermined characteristic of said oscillator output signal subsequent to each said occurrence of said predetermined characteristic of said input signal to cause said simultaneous application of current by said switching means.

3. An oscillator system according to claim 1 wherein said logic means causes said switching means instantaneously to remove current from said other of said current sources from said control voltage storage means in response to said second occurrence of said predetermined characteristic of said oscillator output signal subsequent to each said occurrence of said predetermined characteristic of said input signal.

4. An oscillator system according to claim 3 wherein said reference interval is one and a half times said nominal period of said voltage controlled oscillator output signal.

5. An oscillator system according to claim 1 wherein said switching means includes two pairs of emitter coupled transistors each pair being connected to a respective one of said current sources, and said logic means includes two coincidence gates each having two complementary outputs connected to the bases of a respective pair of said emitter coupled transistors.

6. An oscillator system according to claim 5 wherein said logic means includes a first flip-flop connected to receive said input signal and adapted to be set by each said occurrence of said predetermined characteristic thereof, said first flip-flop having complementary outputs and each of said coincidence gates being conditioned by one of said complementary outputs, said logic means further including a second flip-flop connected to receive as inputs said complementary outputs of said first flip-flop and further having a clocking input connected to receive said output signal from said oscillator, said second flip-flop having two outputs, one of which is connected to further condition one of said coincidence gates and the other of which is connected to reset said first flip-flop;

said reference signal generating means including a single shot responsive to each said individual occurrence of said repetitive predetermined characteristic of said input signal to generate said reference signal, said single shot being connected to further condition the other of said coincidence gates.

7. Apparatus for synchronizing periodic output signals of nominal frequency with repetitive input signals comprising:

a signal generator for generating such periodic output signals;

a phase error detection means for detecting phase error between said input and output signals and for providing a net current indicative of such a phase error; and an integrator means connected to receive and integrate said net current from said phase error detection means and to supply said integral to control to phase of said signal generator;

said phase error detection means comprising a positive constant current source;

a negative constant current source of equal magnitude;

a switching means for switching current from each of said sources to or away from said integrator means;

first flip-flop means responsive to the occurrence of both a first input signal and a subsequent first output signal to cause said switching means to switch current from both said constant current sources simultaneously to said integrator means;

second flip-flop means responsive to the occurrence of a second output signal, subsequent to said first output signal, to cause said switching means to switch current from one of said current sources away from said integrator means; and single shot means responsive to said first input signal to cause said switching means to cause switching of said other current source away from said integrator means after a predetermined single shot interval greater than said output signal nominal period.

* * * * *